United States Patent [19]
Koifman et al.

[11] Patent Number: 5,825,246
[45] Date of Patent: Oct. 20, 1998

[54] LOW VOLTAGE CLASS AB AMPLIFIER

[75] Inventors: Vladimir Koifman, Rishon-Lezion; Yachin Afek, Kfar Saba; Israel Kashat, Netanya, all of Israel

[73] Assignee: Motorola, Inc., Schaumburg, Ill.

[21] Appl. No.: 699,255

[22] Filed: Aug. 19, 1996

[51] Int. Cl.$^6$ ................................ H03F 3/30; H03F 3/45
[52] U.S. Cl. .......................... 330/255; 330/264; 330/267; 330/270
[58] Field of Search .................................... 330/255, 264, 330/265, 267, 268, 270, 259

[56] References Cited

U.S. PATENT DOCUMENTS

| | | | |
|---|---|---|---|
| 4,570,128 | 2/1986 | Monticelli | 330/267 |
| 4,853,645 | 8/1989 | Seevinck et al. | 330/255 |
| 4,857,861 | 8/1989 | Seevinck et al. | 330/255 |
| 4,963,837 | 10/1990 | Dedic | 330/259 X |
| 5,485,123 | 1/1996 | Kiehl | 330/267 X |

OTHER PUBLICATIONS

E. Seevinck, W. de Jager, and P. Buitendijk, "A low–distortion output stage with improved stability for monolithic power amplifiers," IEEE J. Solid–State Circuits, vol. SC–23, pp. 794–801, Jun. 1988.

M. Ismail, "Analog VLSI, Signal and Information Processing", McGraw–Hill, 1994, (ISBN 0–07–032386–0), pp. 142–143.

Horowitz, P., Hill, W.: "The Art of Electronics", Second Edition, Cambridge University Press 1989, ISBN 0–521–37095–7, chapter 2.14 Current Mirrors on pp. 88–91.

Wai–Kai Chen (Editor): "The Circuits and Filters Handbook", CRC Press, IEEE Press, ISBN 0–8493–8341–2, chapter 57.1 Biopolar Biasing Circuits on pp. 1619–1628, 1995.

*Primary Examiner*—James B. Mullins
*Attorney, Agent, or Firm*—Robert M. Handy; Robert D. Atkins

[57] ABSTRACT

The amplifier (200) includes an input stage (220) coupled to two output transistors (281, 282) having a common terminal at the output terminal (206) of the amplifier. Class AB operation of the output transistors (281, 282) is possible at a comparatively low supply voltage. In order to obtain such operation, measurement transistors (271, 272) are coupled to the same control input (283, 284) as the output transistors (281, 282). These measurement transistors (271, 272) are serially coupled to a current mirror (260). The quiescent current of the output transistors (281, 282) is measured and used to produce a feedback signal which is superimposed to the control signals.

11 Claims, 4 Drawing Sheets

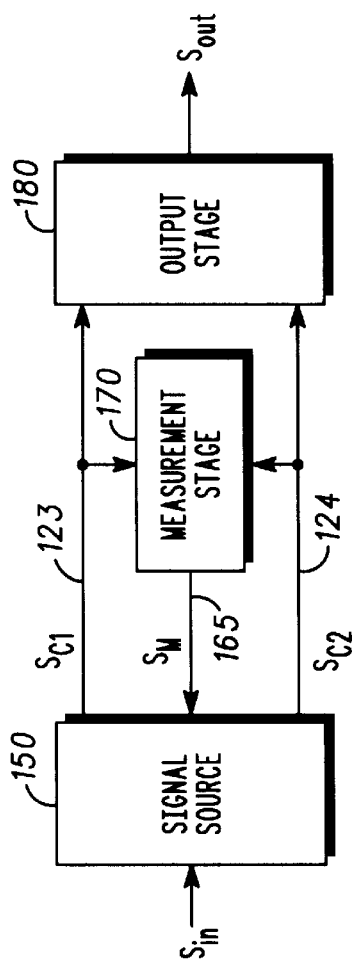
*FIG.1* — PRIOR ART —
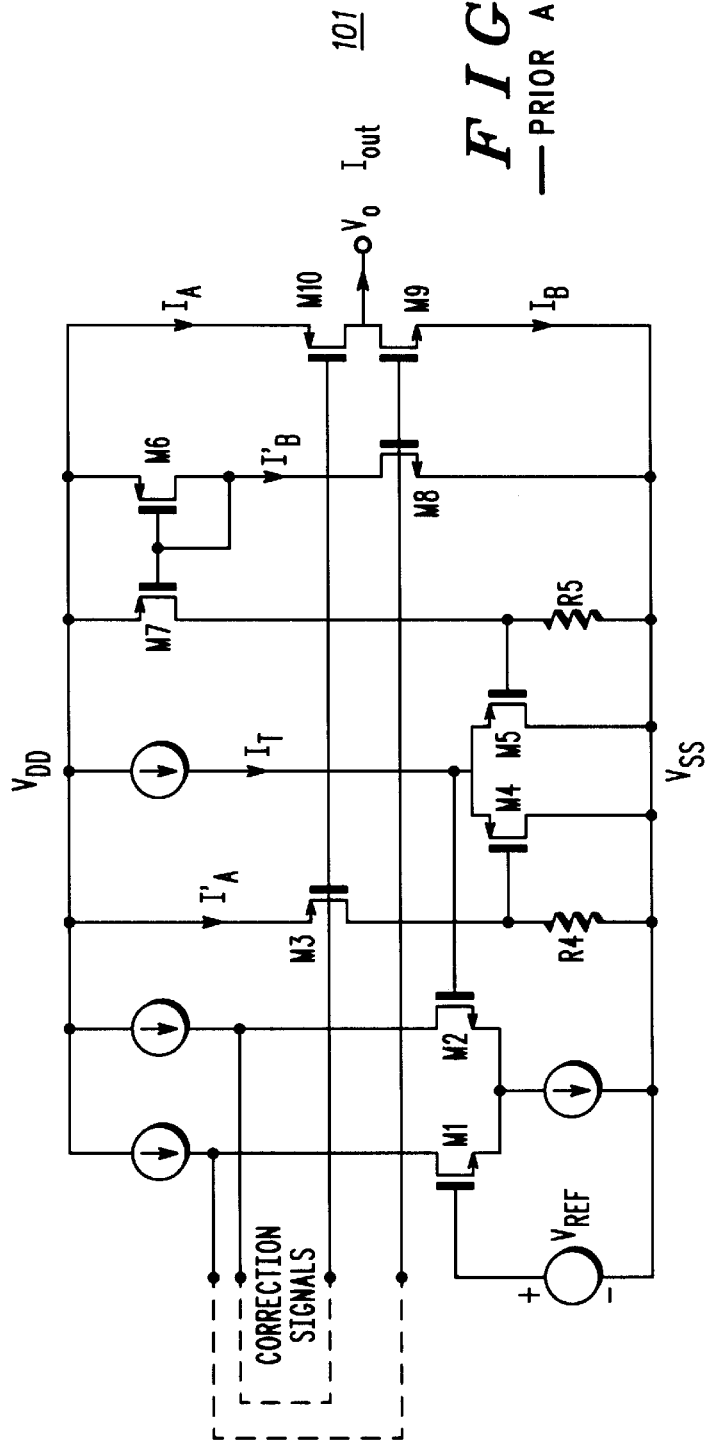
*FIG.2* — PRIOR ART —

LOW VOLTAGE CLASS AB AMPLIFIER

FIELD OF THE INVENTION

The present invention relates in general to amplifiers, and more particularly, to monolithic class AB amplifiers which are suitable for operation at low supply voltages.

BACKGROUND OF THE INVENTION

Class AB amplifiers are able to deliver a relatively high current to a load. To reduce cross-over distortions, the quiescent current in the non-driven output transistor must be controlled by a bias circuit to a small constant value. The supply voltage for the class AB amplifier is determined not only by the output transistors, but also by the bias circuit. This is especially important for low supply voltages.

FIG. 1 is a simplified block diagram of amplifier 100. Amplifier 100 comprises output stage 180, signal source 150, and measurement stage 170. Output stage 180 can be, for example, a class AB transistor arrangement.

Input signal $S_{in}$ is supplied to signal source 150 where a first control signal $S_{C1}$ (123) and a second control signal $S_{C2}$ (124) is generated and send to output stage 180. Control signals $S_{C1}$, $S_{C2}$ have bias components (DC) and information components (AC). The bias components determine the quiescent current in output stage 180. The information components of $S_{C1}$, $S_{C2}$ are amplified to output signal $S_{out}$.

The quiescent current in output stage 180 needs to be stabilized. Therefore, control signals $S_{C1}$, $S_{C2}$ are also supplied to measurement stage 170. Output stage 180 and measurement stage 170 have similar structures. The measurement signal $S_M$ (165) represents the currents in output stage 180. It is used in signal source 150 to control the bias components of signals $S_{C1}$, $S_{C2}$.

FIG. 2 is a simplified circuit diagram of amplifier 101. This is a prior art implementation of amplifier 100. The figure is taken from 'E. Seevinck, W. de Jager, and P. Buitendijk, "A low-distortion output stage with improved stability for monolithic power amplifiers," IEEE J. Solid-State Circuits, vol. SC-23, pp. 794–801, June 1988.'

In amplifier 101, output stage 180 is formed by output transistors M9, M10. Measurement stage 170 is formed by transistors M3, M4, M5, M6, M7, M8 and resistors R4, R5. Signal source 150 is partly formed by transistors M1, M2 and reference voltage source $V_{REF}$.

The following explanation of amplifier 101 is based on: 'M. Ismail, "Analog VLSI, Signal and Information Processing", McGraw-Hill, 1994, (ISBN 0-07-032386-0), pp. 142–143'. Transistors M3 and M8 measure the currents $I_A$, $I_B$ through output transistors M9–M10 and supply scaled currents $I_A'$, $I_B'$. Resistors R4 and R5 convert these scaled currents $I_A'$, $I_B'$ into voltages. These voltages are compared by the differential pair, M4–M5.

Suppose that M10 is delivering the output current $I_{out}$. A load current $I_{AL}$ flows through M10 and a quiescent current $I_{BR}$ flows through M9. The voltage across R4 is much larger than the voltage across R5. The result is that the tail current $I_T$ of M4–M5 flows completely through M5. The source voltage of M4–M5 reflects the minimum current which is the current of the output transistor that is not delivering the output current. If a difference occurs between the source voltage of M4–M5 (measurement signal $S_M$) and that of VREF, the differential amplifier, M1–M2, feeds a correction signal to the output transistors. In this way, the minimum current of the output transistor is controlled.

Suppose that the output stage is at rest. The voltages R4 and R5 are equal and therefore, the tail current $I_T$ of M4 and M5 is equally divided between both transistors. The source voltage of M4 and M5 reflects the quiescent current of the output transistors. Again, if a difference occurs between the source voltage of M4–M5 ($S_M$) and VREF, the differential amplifier M1–M2 feeds a correction signal to the output transistors. In this way, the quiescent current can be controlled.

The circuit of FIG. 2 is suitable for operation at low supply voltages $V_{DD}$–$V_{SS}$ which must only be higher then a single threshold voltage $V_T$ of a field effect transistor (FET).

The circuit of FIG. 2 requires resistors (R4, R5) and transistors (M6,M7) for converting measured currents into voltages which are used as measurement signal $S_M$.

In measurement stage 170, the currents through transistors M6, M8, M3, M7 and resistors R4, R5 can be either the scaled quiescent currents $I_{AR}'$, $I_{BR}'$ or the scaled load currents $I_{AL}'$, $I_{BL}'$ of transistors M9, M10. Second indices 'L' and 'R' stand for load and quiescent currents, respectively. When, for example, output transistor M10 is conducting the load current $I_A$, then the scaled current $I_A'$ through measurement transistor M3 has its maximal value, that is $I_{AL}'$.

Transistors M6, M8, M3, M7 and resistors R4, R5 must therefore be dimensioned to carry scaled load currents $I_{AL}$, $I_{BL}$. This contributes to power dissipation and chip area loss.

There is the task to provide class AB amplifiers suitable for low voltage operation which have optimized quiescent current control and reduced power consumption.

BRIEF DESCRIPTION OF THE DRAWINGS

FIG. 1 is a simplified block diagram of a feedback-biased amplifier;

FIG. 2 is a simplified schematic diagram of the amplifier of FIG. 1 in an embodiment as known in the prior art;

DETAILED DESCRIPTION OF THE DRAWINGS

The amplifier according to the invention has a measurement stage in which the currents are limited to scaled quiescent currents. Measurement transistors are serially coupled to a current mirror.

Figure 3:
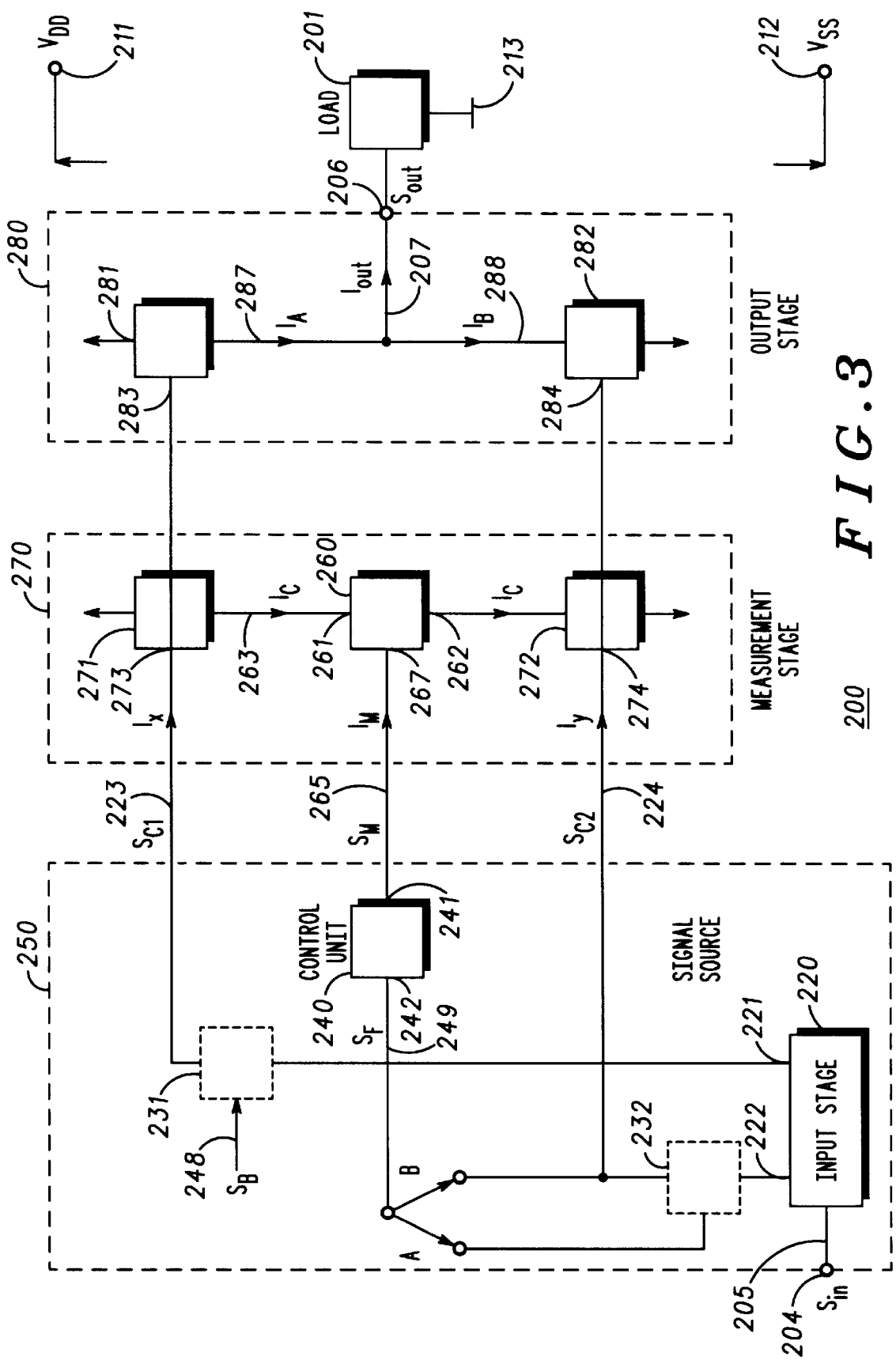
FIG. 3 is a simplified schematic diagram of the amplifier of FIG. 1 in accordance with the invention.

FIG. 3 is a simplified schematic block diagram of amplifier 200 according to the present invention. It is an inventive implementation of amplifier 100 of FIG. 1. In FIG. 1 and FIG. 3, the reference numbers 123/223, 124/224, 150/250, 165/265, 170/270, and 180/280 stand for analogous blocks or signals. However, their operation or function is different as a consequence of the embodiment which will be explained.

Amplifier 200 comprises output stage 280, signal source 250, and measurement stage 270 as shown dashed. Further, amplifier 200 has input terminal 204 for receiving input signal $S_{in}$ and output terminal 206 for supplying output signal $S_{out}$. Elements can be connected to supply rails 211 and 212 having voltages $V_{DD}$ and $V_{SS}$ as indicated by arrows pointing up or pointing down. It is assumed that a load 201 is coupled between output terminal 206 and ground 213. Ground 213 has a voltage between $V_{DD}$ and $V_{SS}$.

Signal source 250 comprises input stage 220, control unit 240, and optional transistors 231, 232.

Output stage 280 comprises output transistors 281 and 282 which are serially coupled between supply rails 211 and 212. Output terminal 206 is coupled to the common electrodes, e.g. to common drains. Preferably, output transistors 281, 282 are symmetrically configured and form a complementary pair. Output transistors 281, 282 have control inputs 283, 284, e.g. gates.

Measurement stage 270 is formed by measurement transistors 271, 272 and by current mirror 260. Measurement transistors 271, 272 are serially coupled between supply rails 211, 212 via input 261 and output 262 of current mirror 260. Each of measurement transistors 271, 272 has similar characteristics as its corresponding output transistor 281, 282. In case the transistors are field effect transistors (FETs), the aspect ratio, that means channel width to length (W/L), is the same for output transistors 281, 282 and measurement transistors 271, 272. Measurement transistors 271, 272 have control inputs 273, 274 (e.g., gates).

Input terminal 204 is coupled to input stage 220. Outputs 221, 222 of input stage are coupled to control inputs 283, 284 of output transistors 281, 282 and to control inputs 273, 274 of measurement transistors 271, 272. It is possible to have identical outputs 221 and 222. The connections between output 221 and control inputs 273, 283 as well as between output 222 and control inputs 274, 284 can include the main current paths (e.g., source-drain path) of optional transistors 231 and 232, respectively.

An external bias signal $S_B$ (248) can be superimposed to at least one of the control signals $S_{C1}$ or $S_{C2}$. The bias signal $S_B$ can directly be applied to the gates of output transistors 281 and 282. $S_B$ can also be applied through the gates of at least one of optional transistors 231 and 232.

Current mirror 260 has signal output 267 coupled to input 241 of control unit 240.

Output 242 of control unit 240 can be coupled to other elements in at least two ways. Cases A and B represent amplifiers 201 and 202 as further embodiments of amplifier 200. Details will be given in connection with FIGS. 4 and 5. In case A, output 242 of control unit 240 can be coupled to the control input (e.g., gate) of optional transistor 232. In case B, output 242 can be coupled to control input 284 of output transistor 282 which is also control input 274 of measurement transistor 272. As a person of skill in the art will understand, output 242 can also be coupled to optional transistor 231 or to output transistor 281.

In signal source 250, input stage 220 receives input signal $S_{in}$ (205) which has information (AC) components. It is not important for the invention whether input signal $S_{in}$ has DC components or if it is differential. In input stage 220, $S_{in}$ is converted into control signals $S_{C1}$ (223) and $S_{C2}$ (224) which drive output transistors 281, 282, respectively. In case outputs 221 and 222 of input stage 220 are identical, $S_{C1}$ and $S_{C2}$ are also identical. Control signals $S_{C1}$ and $S_{C2}$ have bias components (DC) and information components (AC). The bias components control the quiescent current $I_R$ in output stage 280. The information components are amplified. Control signals $S_{C1}$, $S_{C2}$ can be currents $I_x$ and $I_y$ which flow to output transistor 281, 282. Currents $I_x$ and $I_y$ have a DC component which provides bias and an AC component which provides the information of input signal $S_{in}$ to be amplified. The proportion between the DC components of $I_x$ and $I_y$ defines the quiescent current $I_R$. Control signals $S_{C1}$, $S_{C2}$ can be modified by optional transistors 231, 232.

In output stage 280, the currents through the main electrode paths (e.g., source-drain) of output transistors 281, 282 are defined as $I_A$ and $I_B$. It is supposed that output transistors 281 and 282 are never closed (i.e. driven off) at the same time. When output transistor 281 is driven by input stage 220, it pushes load current $I_{AL}$ (287) into load 201 at output terminal 206. At that time, output transistor 282 is not driven and carries the quiescent current $I_{BR}$. Second indices 'L' and 'R' stand for load and quiescent currents, respectively.

When output transistor 282 is driven, it pulls load current $I_{BL}$ (288) from load 201. Output transistor 281 carries the quiescent current $I_{AR}$. The output current $I_{out}$ (output signal $S_{out}$, 207) through load 201 is always $I_{Out}=I_A-I_B$. Output transistors 281, 282 are symmetrical so that the quiescent currents $I_{AR}$ and $I_{BR}$ equal the quiescent current $I_R=I_{AR}=I_{BR}$ of amplifier 200. When no input signal $S_{in}$ is applied, then output transistors 281, 282 are not driven and therefore $I_{Out}=I_{AR}-I_{BR}=0$.

In measurement stage 270, measurement transistors 271, 272 have similar structures as output transistors 281, 282.

Output transistor 281 and measurement transistor 271 are desirably FETs of the same conductivity type and with equal aspect ratio. They receive the same control signal $S_{C1}$. Temperature changes and other environmental changes have the same influence on both transistors. This is used for the indirect measurement of the current $I_A$.

Suppose, measurement transistor 272 would be shorted. The current $I_A'$ through measurement transistor 271 would be scaled to the current $I_A$ that is, $I_A'=I_A*a$, with a as the scale factor.

The current through measurement transistor 272 could be calculated accordingly as $I_B'=I_B*b$ where b is an analogous scale factor.

In amplifier 200 of the present invention, measurement transistors 271, 272 are coupled serially and share the same current path. Therefore, the measuring current $I_C$ (263) through them is limited to $I_A'$ or $I_B'$, whichever current is smaller. $I_C$ is the scaled quiescent current $I'_R$. Since at every time one of output transistors 281, 282 is not conducting, $I_C$ is not a scaled load current $I'_{AL}$, $I'_{BL}$. Assuming equal scale factors a=b=h, measurement current $I_C$ equals $I_C=I'_R=I_R*h$.

The ratio h of measurement current $I_C$ to quiescent current $I_R$ is constant. Therefore, measurement current $I_C$ can be used to control the quiescent current $I_R$. $I_C$ is not directly used to control the output transistors 281, 282. Measurement current $I_C$ is mirrored in current mirror 260. Mirror current $I_M$ is available at signal output 267. $I_M$ is in constant ratio to $I_C$, that is $I_M=I_C*g$, where g is a constant.

Figure 4:
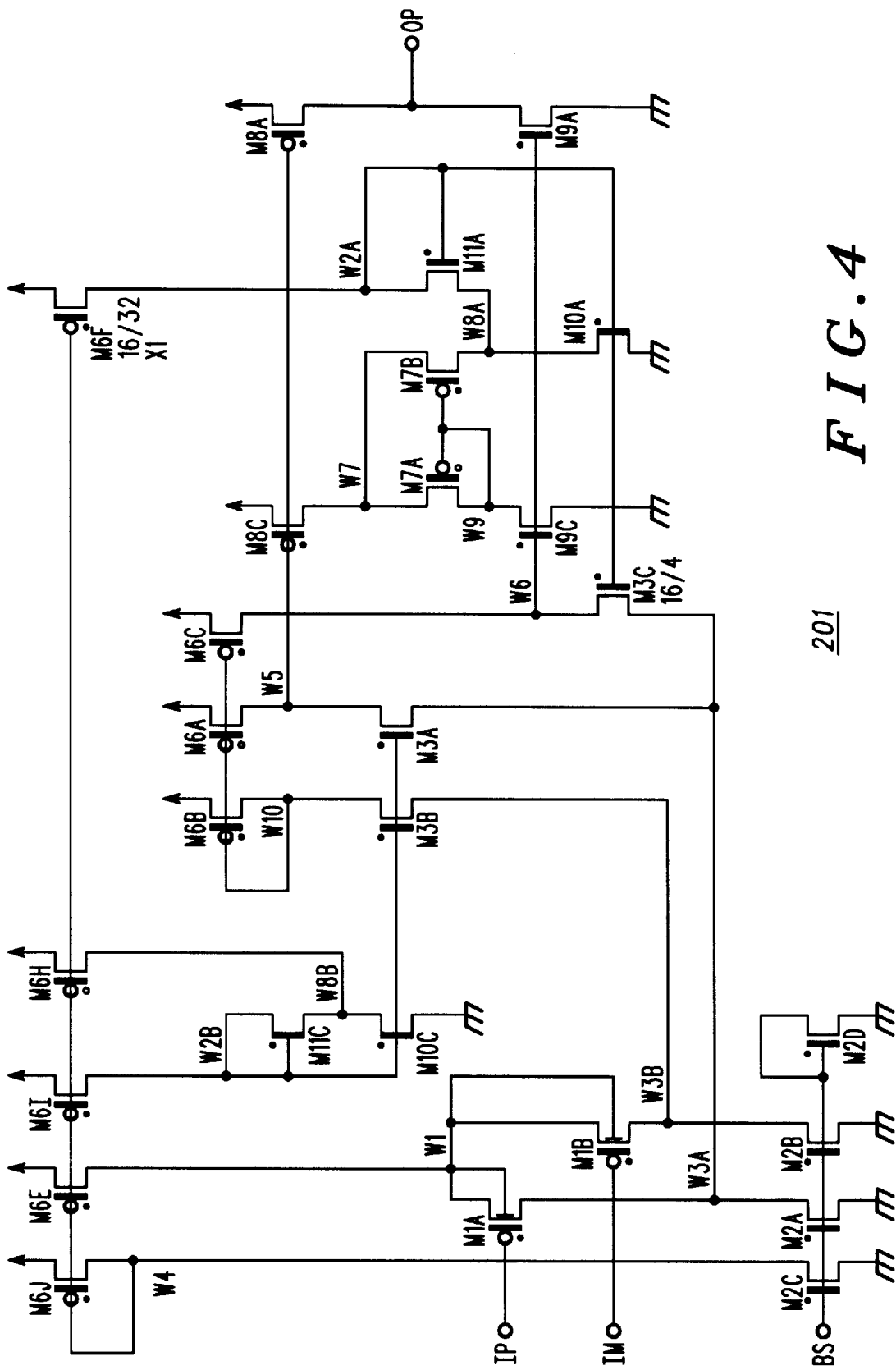
FIG. 4 is a simplified circuit diagram of the amplifier of FIG. 3 in a first best mode embodiment of the invention.
Figure 5:
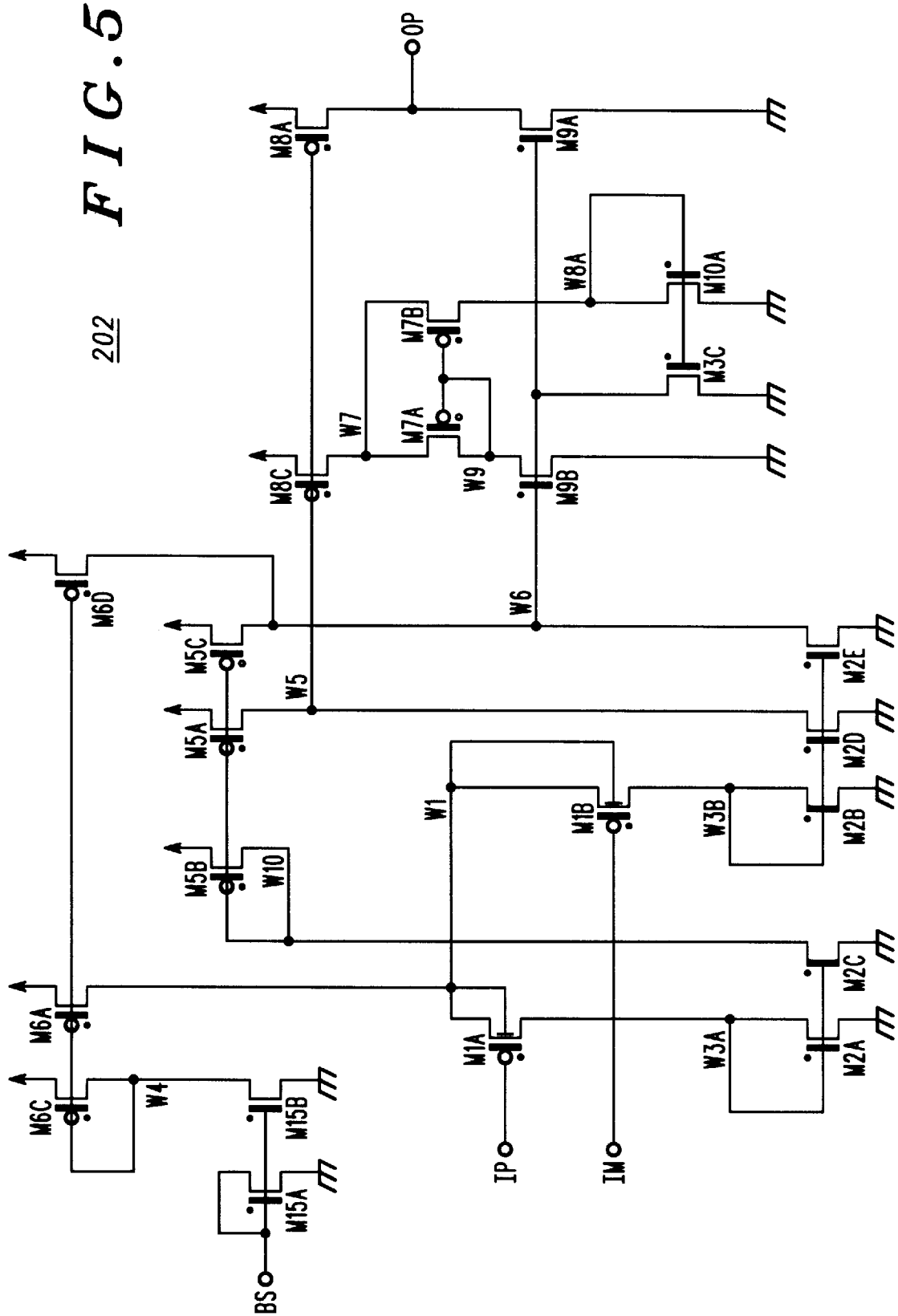
FIG. 5 is a simplified circuit diagram of the amplifier of FIG. 3 in a second best mode embodiment of the invention.

Referring to amplifier 100 of FIG. 1, mirror current $I_M$ is the measurement signal $S_M$ (265). Mirror current $I_M$ is supplied to input 241 of control unit 240. At output 242, the feedback signal $S_F$ (249) is available. Feedback signal $S_F$ is used to control the bias components of control signals $S_{C1}$, $S_{C2}$. By that means, the quiescent current $I_R$ can be controlled and stabilized. There are many options to implement control unit 240 and to have the feedback signal $S_F$ act on the control signals $S_{C1}$, $S_{C2}$. For example, feedback signal $S_F$ can be supplied to the control input (e.g., gate) of optional transistor 232 (case A). Feedback signal $S_F$ can also be superimposed to one of the control signals $S_{C1}$ or $S_{C2}$ (case B). In FIGS. 4, 5 this will be explained with more details.

In amplifier 200 of the invention, measurement transistors 271 and 272 are serially connected to current mirror 260. In amplifier 101 of prior art (FIG. 2), a current mirror (M6–M7) is used to mirror the current of only one measurement transistor (M8). The currents from the measurement transistors M8 and M3 must be transferred by resistors R5 and R4 to voltages and analyzed in a differential pair (M4–M5). According to the invention in amplifier 200 there are no resistors required. Measurement current $I_C$ is directly obtained from measurement transistors 271, 272. Current mirror 260 has a different task, that is, to transfer $I_C$ to $I_M$ which is then used for controlling output transistors 281, 282.

In prior art amplifier 101 as in FIG. 2, the currents $I_A'$, $I_B'$ are actually obtained and used for controlling. The currents $I_A'$, $I_B'$ can be the scaled quiescent currents $I'_{AR}$, $I_{BR}$ or the scaled load currents $I'_{AL}$, $I_{BL}'$. Transistors M6, M3 of prior art amplifier 100 must be able to carry the scaled load currents.

In amplifier 200 according to the invention, measurement transistor 271, 272 must only be able to carry the scaled quiescent currents $I_{AR}'$, $I_{BR}'$. Current mirror 260 carries that same currents. That means that the dimensions of the transistors can be reduced and that chip space can be saved.

Details of amplifier 200 will now be explained in reference to circuit diagrams of FIGS. 4 and 5. FIG. 4 is a simplified circuit diagram of amplifier 201. Amplifier 201 is the first best mode embodiment of amplifier 200 of the invention. In FIG. 4, the elements have reference numbers beginning with, for example, the letters 'M' for transistors and 'W' for nodes. In the following explanation, elements and numbers referring to amplifier 200 of FIG. 3 will be given in parenthesis.

The schematics of the input stage (220) and of a bias providing circuit are not essential for the invention. They can be implemented by a person of skill in the art in many different ways. Therefore and for the purpose of explaining the essential elements only, details had been dispensed with.

Amplifier 201 has been implemented by field effect transistors (FETs) having P-channels and N-channels. Further, the abbreviations P-FET and N-FET are used.

Amplifier 201 has input IP and input IM (input terminal 204) for differentially receiving the input signal $S_{in}$.

The input stage (220) comprises P-FETs M1A and M1B coupled with the gates to inputs IP, IM, respectively, for receiving $S_{in}$ (205). The drain of P-FET M1A is coupled via node W3A (identical outputs 221 and 222) to the sources of N-FETs M3A (231) and M3C (232) for providing identical control signals $S_{C1}$, $S_{C2}$.

Bias is provided by P-FETs M6A, M6B, M6C, M6J, M6E, M6I, M6H, and M6F coupled with the sources to $V_{DD}$ (211) and by N-FETs M2C, M2A, M2B, and M2D coupled with the sources to $V_{SS}$ (212). Bias is controlled externally via bias input BS coupled to the gates of N-FETs M2A, M2B, M2C, and M2D.

The output transistors (281, 282) are implemented by P-FET M8A (281) and N-FET M9A (282). M8A has the source coupled to $V_{DD}$ (211). M9A has the source coupled to $V_{SS}$ (212). The common drains are coupled to output terminal OP (206). The measurement transistors (271, 271) are also complementary FETs. P-FET M8C (271) has the source coupled to $V_{DD}$, N-FET M9C (272) has the source coupled to $V_{SS}$.

The gate (283) of M8A (281) and the gate (273) of M8C (271) are coupled via node W5 to the drain of M3A (231) for receiving control signal $S_{C1}$. The gate (284) of M9A (282) and the gate (274) of M9C (272) are coupled via node W6 to the drain of M3C (232) for receiving control signal $S_{C2}$.

The current mirror (260) comprises P-FETs M7A and M7B. The source of M7A is coupled via node W7 (input 261) to the drain of M8C (271). The drain of M7A is coupled via node W9 (output 262) to the drain of M9C (272). M7A and M7B have the common gates coupled to node W9 and the common sources coupled to node W7. The mirror current $I_M$ is available at the drain of M7B.

N-FETs M10C, M11C and P-FETs M6H, M6I are provided to supply bias signal $S_B$ (248) to M3A (231). A control unit (240) is implemented by N-FETs M11A, M10A and P-FET M6F. $I_M$ ($S_M$) is supplied to the source (241) of M11A. Feedback signal $S_F$ (249) is available at the drain (242) of M11A which is coupled to the gate of M3C (232, cf. case A).

N-FETs M3A (231) and M3C (232) form a differential pair having N-FET M2A as current source and P-FETs M6A and M6C as loads. FETs M6I, M10C, M11C providing bias signal $S_B$ (248) for N-FET M3A (231) and FETs M6F, M10A, M11A providing feedback signal $S_F$ (249) for N-FET M3C (232) are coupled in similar ways. P-FET M6I and N-FETs M10C, M11C are serially arranged with their main current paths between $V_{DD}$ (211) and $V_{SS}$ (212). The source of P-FET M6I is coupled to $V_{DD}$. The drain of M6I is coupled via node W2B to the drain and the gate of N-FET M11C and to the gates of N-FETs M10C and M3A (231). The source of M11C is coupled via node W8B to the drain of M10C. The source of M10C is coupled to $V_{SS}$. P-FET M6H is coupled with its source-drain-path from $V_{DD}$ to node W8B. This configuration provides a reference current through M10C. P-FET M6F and N-FETs M10A, M11A are serially arranged with their main current paths between $V_{DD}$ (211) and $V_{SS}$ (212). The source of P-FET M6F is coupled to $V_{DD}$. The drain of M6F is coupled via node W2A to the drain and gate of N-FET M11A and to the gates of N-FETs M10A and M3C (232). The source of M11A is coupled via node W8A to the drain of M10A. The source of M10A is coupled to $V_{SS}$. The drain of P-FET M7B (output 267 of current mirror 260) is coupled to node W8A for supplying mirror current $I_M$. This configuration provides a reference current through M10A. An equilibrium condition is achieved when the current of M7B ($I_M$) equals the reference current through N-FET M10C.

FIG. 5 is a simplified circuit diagram of amplifier 202. Amplifier 202 is the second best mode embodiment of amplifier 200 of the invention. In FIG. 5, the elements have reference numbers beginning with, for example, the letters 'M' for transistors and 'W' for nodes. In the following explanation, elements and numbers referring to amplifier 200 of FIG. 3 will be given in parenthesis.

The schematics of the input stage (220) and of a bias providing circuit are not essential for the invention. They can be implemented by a person of skill in the art in many different ways. Therefore and for the purpose of explaining the essential elements only, details had been dispensed with.

Amplifier 202 has been implemented by field effect transistors (FETs) having P-channels and N-channels. Further, the abbreviations P-FET and N-FET are used.

Amplifier 202 has input IP and input IM (input terminal 204) for differentially receiving the input signal $S_{in}$.

The input stage (220) comprises P-FETs M1A, M1B coupled at the gates to inputs IP, IM, respectively, for receiving $S_{in}$. Bias is provided by N-FETs M2A, M2B, M2C, M15A, and M15B coupled with the sources to $V_{SS}$ (212) and by P-FETs M6A, M6C and M5B coupled with the sources to $V_{DD}$ (211). Bias is controlled externally via bias input BS coupled to the gates of N-FETs M15A and M15B. The input stage (220) further comprises P-FET M5A, M5C and N-FET M2D and M2E acting as driver transistors. The sources of M5A and M5C are coupled to $V_{DD}$ (211), the sources of M2D and M2E are coupled to $V_{SS}$ (212). The gates of M5A and M5C are coupled via M5B and M2C to the drain of M1A. The gates of M2D and M2E are coupled to the drain of M1B. The drains of M5A and M2D are coupled in node W5 (output 222). The drains of M5C and M2E are coupled in node W6 (output 221).

P-FET M6D is coupled with the source to $V_{DD}$ and has a common gate with P-FET M6A and M6C. The drain of M6D is coupled to node W6 (output 221) to superimpose a bias signal $S_B$ (248) to the control signal $S_{C1}$.

The output transistors (281, 282) are implemented by P-FET M8A (281) and N-FET M9A (282). M8A has the source coupled to $V_{DD}$ (211). M9A has the source coupled to $V_{SS}$ (212). The common drains are coupled to output terminal OP (206). The measurement transistors (271, 272) are also complementary FETs. P-FET M8C (271) has the source coupled to $V_{DD}$, N-FET M9B (272) has the source coupled to $V_{SS}$.

The gate (283) of M8A (281) and the gate (273) of M8C (271) are coupled to node W5 (221) for receiving control signal $S_{C1}$ (223). The gate (284) of M9A (282) and the gate (274) of M9B (272) are coupled to node W6 (222) for receiving control signal $S_{C2}$ (224).

The current mirror (260) comprises P-FETs M7A and M7B. The source of M7A is coupled via node W7 (261) to the drain of M8C (271). The drain of M7A is coupled via node W9 (262) to the drain of M9B (272). M7A and M7B have the common gates coupled to node W9 and the common sources coupled to node W7. The mirror current $I_M$ ($S_M$) is available at the drain of M7B (267) coupled to node W8A (241).

A control unit (240) is implemented by N-FETs M3C and M10A. The drains of M3C and M10A are coupled to $V_{SS}$ (212). The gates of M3C and M10A and the drain of M10A are coupled to node W8A (241). The drain of M3C (242) is coupled to the gate (284) of M9A (282) for providing the feedback signal $S_F$ (249). N-FET M3C controls the current of M9A (output transistor 282) directly. The current of M8A (output transistor 281) is controlled indirectly via a global feedback loop. This loop is coupled between output terminal 206 and input IM and can easily be implemented by a person skilled in the art.

The prior art amplifier and the inventive amplifier can operate at supply voltages $V_{DD}$–$V_{SS}$ which must only be higher then a single threshold voltage $V_T$ of a FET. Both amplifiers have a rail-to-rail capability for the output signal $S_{out}$.

In the prior art amplifier, the high load currents are mirrored. However, in the inventive amplifier, the smaller quiescent currents are mirrored. That gives the inventive amplifier an advantage regarding power consumption and chip area.

The power dissipation in the non-driven output transistor is substantially constant because the quiescent current flowing therethrough is accurately fixed and is substantially constant.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims. The invention is not limited to the embodiments shown herein. Several modifications are conceivable to those skilled in the art without departing from the scope of the invention. For example, the parts of the embodiments shown can be combined with one another in various ways and it is also possible to utilize transistors of opposite conductivity types.

We claim:
1. An amplifier comprising:
a first output transistor and a second output transistor each having a first main terminal, a second main terminal and a control terminal, whose main current paths are arranged in series and are further coupled to an output terminal for connecting a load;
a first measurement transistor and a second measurement transistor which are serially coupled for generating a measuring current proportional to a quiescent current flowing through said first output transistor and second output transistor;
a signal source for driving said first output transistor and said second output transistor, and for driving said first measurement transistor and said second measurement transistor;
a current mirror receiving said measuring current and providing a mirror current; and
a control unit responsive to the mirror current for controlling the quiescent current in said first output transistor and said second output transistor to have a predetermined value.

2. The amplifier of claims 1 wherein said current mirror comprises a first current mirror transistor with first and second main electrodes serially coupled between said first and second measurement transistors and a control electrode coupled to said first main electrode, and a second current mirror transistor having a first principal electrode coupled to the second main electrode of said first current mirror transistor and a second principle electrode coupled to the control terminal of said first or second output transistor and having a control electrode coupled to said control electrode of said first current mirror transistor.

3. The amplifier of claim 1 where said first output transistor and said second output transistor are field effect transistors (FETs) having different channel types.

4. The amplifier of claim 1 where said first measurement transistor and said first output transistor are FETs having the same channel type, and where said second measurement transistor and said second output transistor are also FETs having the same channel type.

5. The amplifier of claim 1 where said first output transistor and said second output transistor and said first measurement transistor and said second measurement transistor are FETs having same aspects ratios, respectively.

6. The amplifier of claim 1 wherein said mirror current is proportionally related to said measurement current.

7. An amplifier comprising:
a signal source for providing a first control signal and a second control signal;
a first output transistor and a second output transistor serially coupled, said output transistors having a control input each for receiving the first control signal and the second control signal;
a current mirror having an input and an output for passing through a measuring current and having a signal output for providing a mirror current which is in a fixed ratio to the measuring current;
a first measurement transistor and a second measurement transistor serially coupled with said current mirror for providing the measuring current, said first measurement transistor and second measurement transistor each having a control input coupled to said signal source; and
a control unit coupled to said current mirror and to at least one of said output transistors for receiving the mirror current and providing a feedback for stabilizing a quiescent current through said output transistors.

8. An apparatus comprising:

a first transistor for temporarily pulling a first node to a first reference line by carrying a first current;

a second transistor for temporarily pulling a second node to a second reference line by carrying a second current;

a third transistor having a first main electrode coupled to said first node, a second main electrode coupled to said second node and a control electrode coupled to said second node; and a fourth transistor having a first main electrode coupled to the first main electrode of said third transistor, a second main electrode carrying a third current to said second reference line, and a control electrode coupled to said control electrode of said third transistor, said third current being proportional to a minimum value of said first and second currents.

9. A circuit comprising:

first and second output transistors serially coupled between first and second reference lines;

first and second measurement transistors and a current mirror serially coupled between said first and second reference lines, said first transistors receiving a first control signal and said second transistors receiving a second control signal, said current mirror providing a measurement current which is related to a quiescent current through said first and second output transistors; and a control unit receiving said measurement current from said current mirror and providing a feedback to said quiescent current by changing an impedance of a transistor coupled between an input of one of said first and second output transistors and a reference line.

10. An amplifier having first and second reference lines, receiving differentially first and second input signals and providing a single output signal, said amplifier comprising:

first and second transistors coupled between said first and second reference lines and a first node to provide said output signal;

third, fourth, and fifth transistors serially coupled between said first and second reference lines, said third and fifth transistors having control electrodes coupled to control electrodes of said first and second transistors, respectively, said third, fourth, and fifth transistors providing a measurement current which is scaled to a quiescent current through said first and second transistors;

a current mirror providing currents only derived from said first input signal; and sixth and seventh transistors having first main electrodes coupled to said current mirror and having second main electrodes coupled together to a second node which has a potential derived from said second input signal, said first main electrode of said sixth transistor being coupled to said control electrode of said first transistor, and said first main electrode of said seventh transistor being coupled to said control electrode of said second transistor, said seventh transistors being controlled by said measurement current.

11. An apparatus comprising:

first and second transistors having first main electrodes coupled together to a first node which follows a first input signal and having second main electrodes coupled to variable current sources which follow a second input signal;

third and fourth transistors coupled to a second node to provide a single output signal, said third and fourth transistors having control electrodes coupled to said second main electrodes of said first and second transistors, respectively; and a transistor arrangement coupled to said third and fourth transistors for providing a signal depending on a quiescent current through said third and fourth transistors, said signal controlling at least one of said first and second transistors.

* * * * *